(12) United States Patent
Kopp et al.

(10) Patent No.: US 10,879,424 B2
(45) Date of Patent: Dec. 29, 2020

(54) RADIATION-EMITTING SEMICONDUCTOR CHIP, OPTOELECTRONIC COMPONENT COMPRISING A RADIATION-EMITTING SEMICONDUCTOR CHIP, AND METHOD OF COATING A RADIATION-EMITTING SEMICONDUCTOR CHIP

(71) Applicant: OSRAM Opto Semiconductors GmbH, Regensburg (DE)

(72) Inventors: Fabian Kopp, Penang (MY); Attila Molnar, Penang (MY); Cheng Kooi Tan, Penang (MY)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 15/775,148

(22) PCT Filed: Nov. 10, 2016

(86) PCT No.: PCT/EP2016/077313
§ 371 (c)(1),
(2) Date: May 10, 2018

(87) PCT Pub. No.: WO2017/081181
PCT Pub. Date: May 18, 2017

(65) Prior Publication Data
US 2018/0337309 A1 Nov. 22, 2018

(30) Foreign Application Priority Data
Nov. 12, 2015 (DE) .......................... 10 2015 119 553

(51) Int. Cl.
*H01L 33/46* (2010.01)
*H01L 33/50* (2010.01)
(Continued)

(52) U.S. Cl.
CPC ............ *H01L 33/46* (2013.01); *H01L 33/507* (2013.01); *H01L 33/32* (2013.01); *H01L 33/483* (2013.01); *H01L 2933/0025* (2013.01)

(58) Field of Classification Search
None
See application file for complete search history.

(56) References Cited

U.S. PATENT DOCUMENTS 5,955,837 A 9/1999 Horikx et al.
8,575,633 B2 * 11/2013 Donofrio ................ H01L 33/46
257/79

(Continued)

FOREIGN PATENT DOCUMENTS

| CN | 103343943 A | 10/2013 |
|---|---|---|
| DE | 101 12 542 A1 | 10/2002 |

(Continued)

*Primary Examiner* — Alexander G Ghyka
(74) *Attorney, Agent, or Firm* — DLA Piper LLP (US)

(57) ABSTRACT

A radiation-emitting semiconductor chip includes a substrate; an epitaxial semiconductor layer sequence having an active zone that generates electromagnetic radiation of a first wavelength range, wherein the substrate is transparent to electromagnetic radiation of the active zone; and an optically active layer arranged on a side surface of the substrate and on a rear main surface of the semiconductor chip, which lies opposite to a radiation exit surface of the semiconductor chip.

8 Claims, 5 Drawing Sheets

(51) Int. Cl.
*H01L 33/32* (2010.01)
*H01L 33/48* (2010.01)

(56) References Cited

U.S. PATENT DOCUMENTS

| | | | |
|---|---|---|---|
| 2004/0087050 | A1 | 5/2004 | Uemura et al. |
| 2005/0133796 | A1 | 6/2005 | Seo et al. |
| 2006/0138449 | A1* | 6/2006 | Hon ............... H01L 33/105 |
| | | | 257/103 |
| 2008/0179605 | A1 | 7/2008 | Takase et al. |
| 2011/0297914 | A1* | 12/2011 | Zheng ............... H01L 33/46 |
| | | | 257/13 |
| 2013/0000705 | A1* | 1/2013 | Shappir ........... H01L 31/02363 |
| | | | 136/255 |
| 2013/0099266 | A1* | 4/2013 | Wittmann ......... H01L 25/0753 |
| | | | 257/98 |
| 2014/0103379 | A1 | 4/2014 | Sato et al. |
| 2014/0306176 | A1* | 10/2014 | Chiu ............... H01L 33/06 |
| | | | 257/13 |
| 2015/0155458 | A1* | 6/2015 | Huang ............. H01L 33/641 |
| | | | 438/27 |

FOREIGN PATENT DOCUMENTS

| | | |
|---|---|---|
| DE | 10 2006 041 460 A1 | 3/2008 |
| DE | 10 2012 110 188 A1 | 5/2013 |
| DE | 10 2014 105 799 A1 | 10/2015 |
| WO | 01/61765 A1 | 8/2001 |
| WO | 03/036691 A2 | 5/2003 |

\* cited by examiner

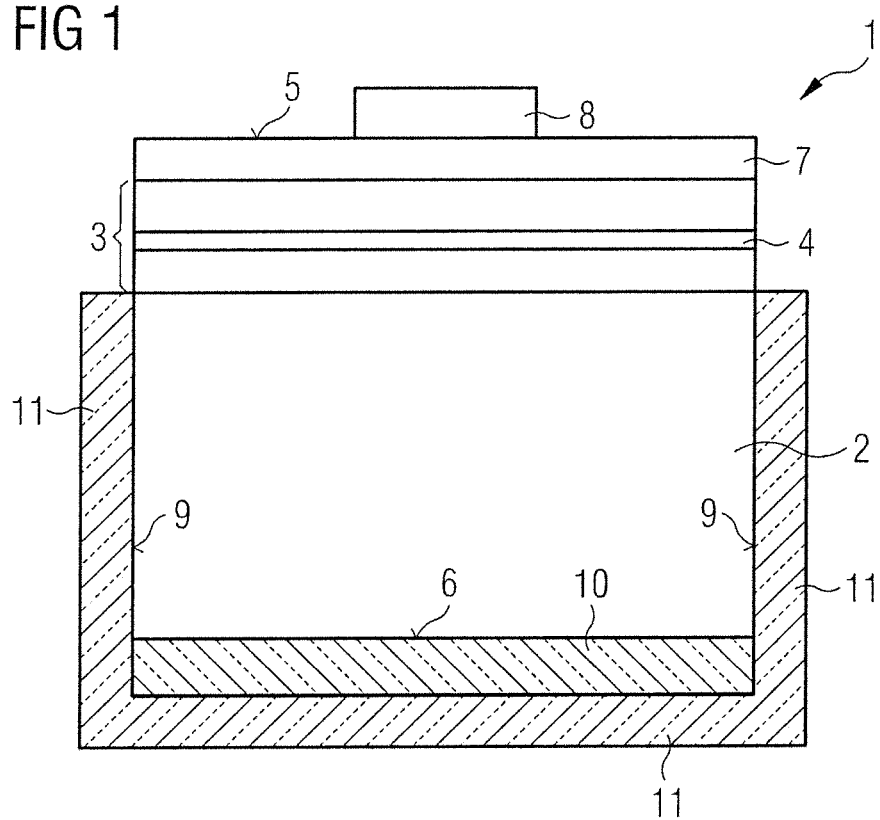
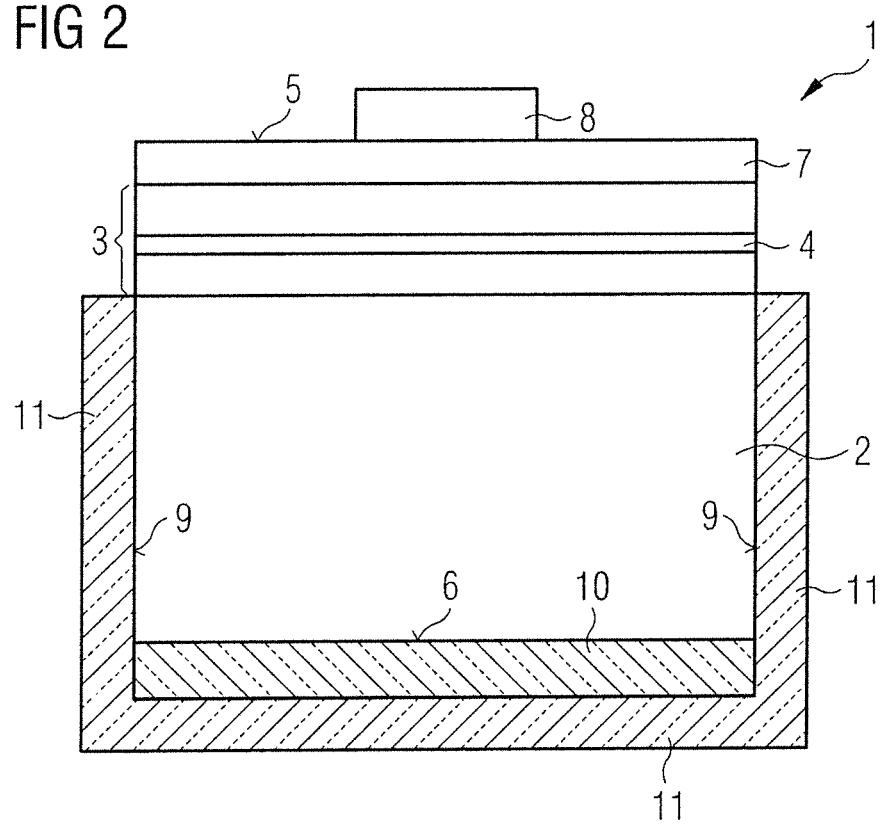

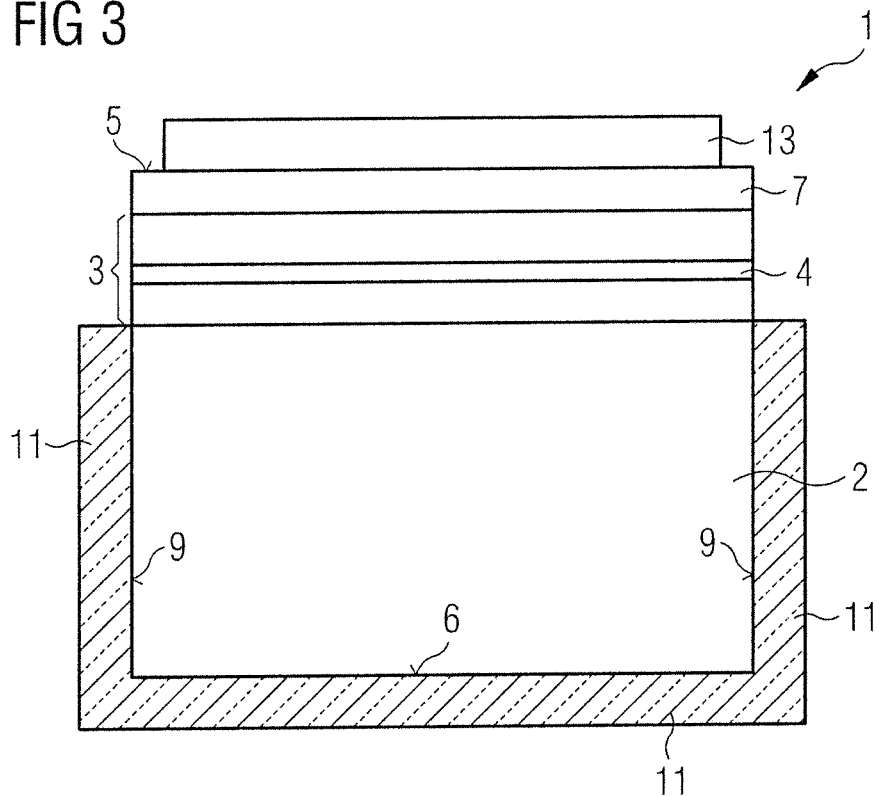
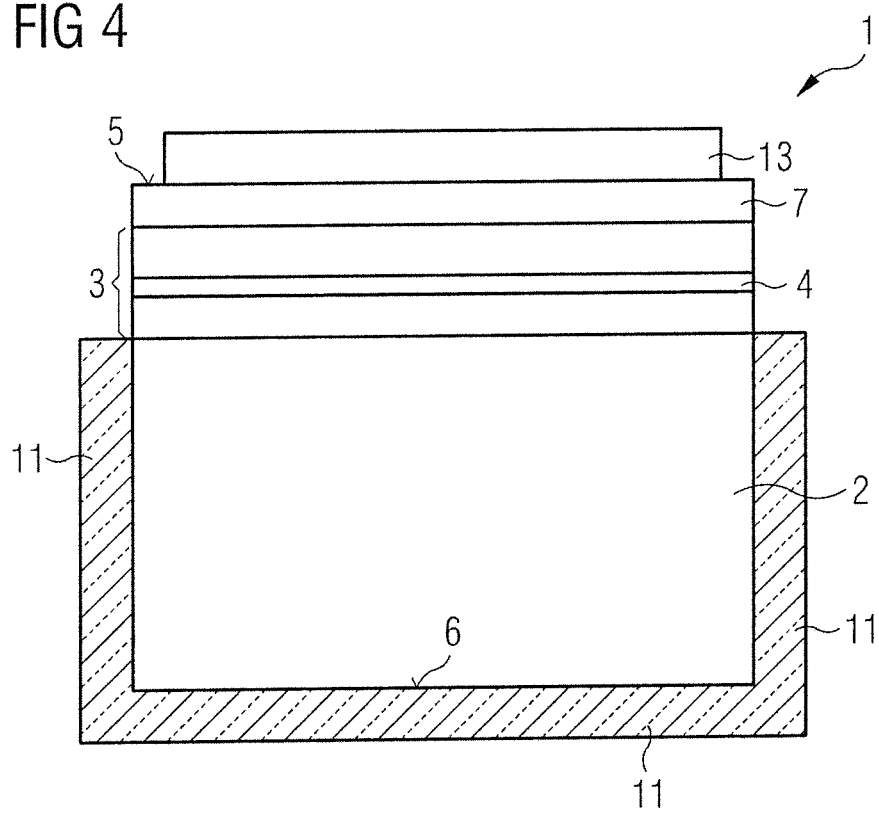

RADIATION-EMITTING SEMICONDUCTOR CHIP, OPTOELECTRONIC COMPONENT COMPRISING A RADIATION-EMITTING SEMICONDUCTOR CHIP, AND METHOD OF COATING A RADIATION-EMITTING SEMICONDUCTOR CHIP

TECHNICAL FIELD

This disclosure relates to a radiation-emitting semiconductor chip, an optoelectronic component having a radiation-emitting semiconductor chip and a method of coating a radiation-emitting semiconductor chip.

BACKGROUND

A radiation-emitting semiconductor chip is described, for example, in WO 01/61765 A1.

There is nonetheless a need to provide a radiation-emitting semiconductor chip in which the brightness can be adjusted in a suitable manner as well as a method of producing such a semiconductor chip and an optoelectronic component having such a semiconductor chip.

SUMMARY

We provide a radiation-emitting semiconductor chip including a substrate; an epitaxial semiconductor layer sequence having an active zone that generates electromagnetic radiation of a first wavelength range, wherein the substrate is transparent to electromagnetic radiation of the active zone; and an optically active layer arranged on a side surface of the substrate and on a rear main surface of the semiconductor chip, which lies opposite to a radiation exit surface of the semiconductor chip.

We also provide an optoelectronic component including the semiconductor chip including a substrate; an epitaxial semiconductor layer sequence having an active zone that generates electromagnetic radiation of a first wavelength range, wherein the substrate is transparent to electromagnetic radiation of the active zone; and an optically active layer arranged on a side surface of the substrate and on a rear main surface of the semiconductor chip, which lies opposite to a radiation exit surface of the semiconductor chip.

We further provide a method of coating a radiation-emitting semiconductor chip including providing a plurality of semiconductor chips on a film, wherein a radiation exit surface of the semiconductor chips adjoins the film and a rear main surface of the semiconductor chips is freely accessible, is opposite the radiation exit surface, and the semiconductor chips are arranged remote from the film so that regions between the side surfaces of two directly adjacent semiconductor chips are freely accessible, and depositing an optically active layer on the semiconductor chip.

We further yet provide a radiation-emitting semiconductor chip including a substrate; an epitaxial semiconductor layer sequence having an active zone that generates electromagnetic radiation of a first wavelength range, wherein the substrate is transparent to electromagnetic radiation of the active zone, and an optically active layer arranged on a side surface of the substrate and on a rear main surface of the semiconductor chip that lies opposite to a radiation exit surface of the semiconductor chip, wherein the optically active layer is a Bragg mirror.

BRIEF DESCRIPTION OF THE DRAWINGS

FIGS. 1 to 6 each show a schematic sectional illustration of a semiconductor chip according to an example.

DETAILED DESCRIPTION

Figure 5:
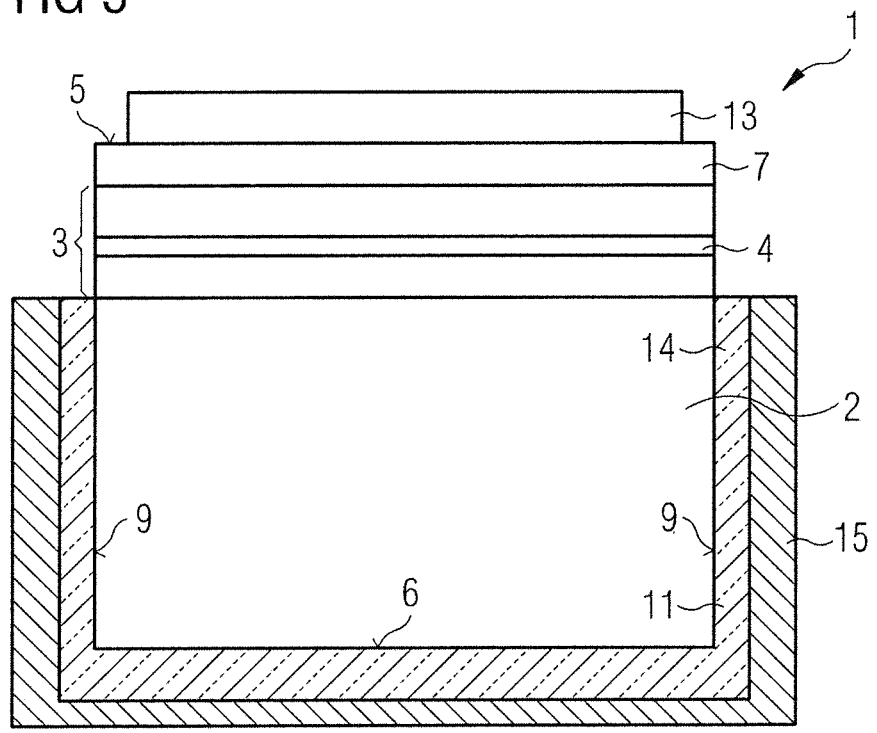

Our radiation-emitting semiconductor chip comprises in particular a substrate and an epitaxial semiconductor layer sequence. The epitaxial semiconductor layer sequence has an active zone suitable for generating electromagnetic radiation of a first wavelength range. The substrate is particularly preferably transparent for electromagnetic radiation of the active zone. In this context, transparent to electromagnetic radiation of the active zone means, in particular, that at least 80%, preferably at least 90% and particularly preferably at least 95% of the radiation generated in the active zone is transmitted.

Particularly preferably, the substrate is a growth substrate for the epitaxial semiconductor layer sequence. The epitaxial semiconductor layer sequence is particularly preferably grown epitaxially on the substrate.

For example, the substrate comprises silicon carbide, gallium nitride or sapphire or consists of silicon carbide, gallium nitride or sapphire.

The epitaxial semiconductor layer sequence is preferably based on a nitride compound semiconductor. Nitride compound semiconductors contain nitrogen as the materials from the system $In_xAl_yGa_{1-x-y}N$ where $0 \leq x \leq 1$, $0 \leq y \leq 1$ and $x+y \leq 1$. Within the group of radiation-emitting semiconductor chips based on nitride compound semiconductors in particular such semiconductor chips are included, in which the epitaxially produced semiconductor layer sequence contains at least one individual layer, which has a nitride compound semiconductor.

For example, the epitaxial semiconductor layer sequence is based on gallium nitride. A semiconductor layer sequence, which is based on gallium nitride, preferably has at least one individual layer containing gallium nitride. The plurality of individual layers preferably contains gallium nitride.

Particularly preferably, the active zone generates electromagnetic radiation from the blue spectral region. Furthermore, it is also possible for the active zone to generate green light. The electromagnetic radiation generated in the active zone is emitted by the semiconductor chip from a radiation exit surface. Due to the radiation-transmissive substrate, a portion of the radiation generated in the active zone is also emitted via side surfaces of the substrate. Such a semiconductor chip is also called "volume emitter."

The semiconductor chip may comprise an optically active layer applied to a side surface of the substrate and a rear main surface of the semiconductor chip, which lies opposite to the radiation exit surface of the semiconductor chip.

If the term "the side surface" is mentioned, in the case that the substrate or the semiconductor chip has a plurality of side surfaces, all side surfaces are meant, unless expressly stated otherwise.

For example, the optically active layer is applied over the entire surface to the rear main surface of the semiconductor chip and is applied over the entire surface of the side surface of the substrate.

Alternatively, it is also possible for regions of the side surface of the substrate adjoining the rear main surface is covered continuously with the optically active layer, while a further region of the side surface of the substrate is free of the optically active layer. The region of the side surface, which is free from the optically active layer, preferably adjoins the radiation exit surface or is arranged at least closer towards the radiation exit surface than the region covered with the optically active layer.

The thickness of the optically active layer on the side surface of the substrate may decrease from the rear main surface to the radiation exit surface. Particularly preferably, the decrease in the thickness of the optically active layer takes place continuously.

The optically active layer may be a single layer or a layer sequence comprising a plurality of layers.

The optically active layer may be a metallic layer or a semiconductor layer. In other words, the optically active layer consists of a metal or a semiconductor or comprises a metal or a semiconductor. Particularly preferably, an optically active layer, comprising a metal or a semiconductor or consists of a metal or a semiconductor absorbs, absorbs radiation of the active zone, preferably over the entire spectral range of the first wavelength range. In this way, the brightness of the semiconductor chip may be set to a desired value.

For example, an optically active layer having a semiconductor or metal or formed from a metal or a semiconductor has an absorption coefficient for blue radiation of the active zone of $0.2 \cdot 10^5$ cm$^{-1}$ to $15 \cdot 10^5$ cm$^{-1}$.

The thickness of an optically active layer which has a semiconductor or a metal or is formed from a metal or a semiconductor is, for example, 1 nanometer to 1000 nanometers. The thickness of the optically active layer is preferably 1 nanometer to 100 nanometers.

Depending on the absorption coefficient, the optically active layer is optically dense at different thicknesses so that no light is transmitted. The thickness of the optically active layer and its absorption coefficient determine the proportion of the radiation transmitted or absorbed by the optically active layer.

Furthermore, the metallic layer or the semiconductor layer may be an individual layer or also a layer sequence comprising a plurality of individual layers.

For example, one of the following materials is suitable as the material for the metallic layer or the semiconductor layer: gold, silver, platinum, palladium, titanium, rhodium, ruthenium, tungsten, aluminum, silicon, germanium, indium, chromium, nickel, copper.

Preferably, the optically active layer is formed as a layer sequence of two metallic individual layers. In this case, the one metallic layer is formed, for example, in an absorbing manner for the radiation of the active zone, while the other metallic layer is, for example, a noble metal layer. The absorbent metal layer and the noble metal layer are preferably in direct contact with one another, wherein the absorbing metal layer is applied directly to the substrate and the noble metal layer is freely accessible from the outside.

In this case, the absorbing metallic individual layer absorbs part of the radiation of the active zone in a targeted manner, which impinges on it and thereby controls the brightness of the semiconductor chip, while the noble metal layer encapsulates the absorbent metal layer and at least reduces degradation of the absorbent metallic layer, for example, by corrosion. For example, the absorbent metal layer can be a titanium layer and the noble metal layer can be a gold layer.

Instead of a noble metal layer, it is also possible to use another metallic layer for encapsulating the absorbent layer, for example, a chromium layer. Chromium has the advantage of forming a stable oxide in a moist environment so that an underlying absorbing layer is protected against oxidation. In this respect, a chromium layer can fulfil a similar function as a noble metal layer.

Preferably, the optically active layer is formed as a layer sequence of two metallic individual layers. In this case, the one metallic layer is formed, for example, in an absorbing manner for the radiation of the active zone, while the other metallic layer encapsulates the absorbent metallic layer. The absorbing metal layer and the other metallic layer are preferably in direct contact with one another, wherein the absorbing metal layer is applied directly to the substrate and the other metallic layer is freely accessible from the outside.

Particularly preferably, the optically active layer is formed as a layer sequence of two metallic individual layers, wherein the one metallic layer is formed absorbing for the radiation of the active zone and the other metallic layer encapsulates the absorbing metallic layer. The absorbing metallic layer is preferably formed from titanium and has, for example, a thickness of approximately 100 nanometers. The further metallic layer is formed, for example, from chromium and has, for example, a thickness of approximately 200 nanometers.

Furthermore, it is also possible for the one metallic layer to be formed as an adhesion-promoting layer between the rear side material of the semiconductor chip and the further metallic layer. In this case, the optical properties of the optically active layer are generally determined to the greatest extent by the optical properties of the further metallic layer.

Furthermore, it is also possible for the optically active layer to have at least one metallic layer and at least one dielectric layer or also at least two dielectric layers.

The optically active layer may be a Bragg mirror. A Bragg mirror is a layer sequence of alternating individual layers formed generally dielectrically.

For example, the Bragg mirror may increase the coupling-out of the radiation of the active zone from the side surface of the substrate.

The Bragg mirror may be formed to transmit the radiation from the active zone and optionally increase the coupling out of the side surface and reflect electromagnetic radiation outside the first wavelength range. Particularly preferably, the Bragg mirror is formed to transmit radiation of the active zone such as blue light, or to increase the coupling out thereof and to reflect yellow and/or green and/or red light. Such a radiation-emitting semiconductor chip is particularly suitable for being used in an optoelectronic component having a conversion element, which converts primary blue light partially into yellow and/or green and/or red light. The use of such a semiconductor chip in such an optoelectronic component advantageously leads to an increase in efficiency of the component.

The Bragg mirror may reflect a spectral component of the radiation of the first wavelength range and transmits a further spectral component of the first wavelength range. In other words, in this example, the Bragg mirror filters out a spectral part of the first wavelength range so that only a very narrow band of the first wavelength range is coupled out at least from the side surfaces of the substrate. For example, the band has a width between 1 nanometer inclusive and 50 nanometers inclusive.

The Bragg mirror may absorb radiation of the active zone in a targeted manner, preferably over the entire spectral range of the first wavelength range. In this way, the brightness of the semiconductor chip can likewise be set to a desired value.

For example, the following materials are suitable for the individual layers of the Bragg mirror: aluminum oxide, tantalum oxide, zirconium oxide, silicon nitride, silicon dioxide, silicon oxynitride, niobium oxide or transparent conductive oxides, in particular ITO, ZnO and $In_2O_3$.

Transparent conductive oxides (TCO) are generally metal oxides such as, for example, zinc oxide, tin oxide, cadmium oxide, titanium oxide, indium oxide or indium tin oxide (ITO). In addition to binary metal-oxygen compounds such as, for example, ZnO, $SnO_2$ or $In_2O_3$, ternary metal-oxygen compounds such as, for example, $Zn_2SnO_4$, ZnSnO3, $MgIn_2O_4$, $GaInO_3$, $Zn_2In_2O_5$ or $In_4Sn_3O_{12}$ or mixtures of different transparent conductive oxides also belong to the group of TCOs. Furthermore, the TCOs do not necessarily have a stoichiometric composition and can furthermore also be p-doped and n-doped.

A Bragg mirror generally comprises an alternating sequence of individual layers each with a high (n>1.7) and a low refractive index (n≤1.7). In the case of a Bragg mirror, which increases the coupling-out, the optical layer thickness n*d of an individual layer is typically n*d=$\lambda$/2, wherein the first individual layer of the layer sequence can also have an optical layer thickness of n*d=$\lambda$. In a reflecting or highly reflective Bragg mirror, however, the optical layer thickness of the individual layers is typically n*d=$\lambda$/4, wherein the first individual layer can also have an optical layer thickness of n*d=3$\lambda$/4.

The radiation exit surface thereof may be provided with an absorption layer that absorbs the radiation of the active zone in a targeted manner to set the brightness of the semiconductor chip to a desired value. For example, the absorption layer is provided at the same time to inject a current into the semiconductor layer sequence and serve for electrical contacting. In this case, the absorption layer is generally structured. Preferably, the absorption layer comprises two separate structural elements, each provided as an electrical contact and which furthermore simultaneously occupy a comparatively large surface area at the radiation exit surface to absorb radiation of the active zone.

For example, the absorption layer may be a metallic layer. The absorption layer may have, for example, one of the following materials or consist of one of the following materials: gold, silver, platinum, palladium, titanium, rhodium, ruthenium, tungsten, aluminum, chromium, nickel, copper.

The absorption layer may have a thickness of 300 nanometers to 4000 nanometers.

A further highly reflective Bragg mirror that reflects radiation of the active zone may be applied on the rear main surface of the substrate. The further highly reflective Bragg mirror is formed, to direct the radiation of the active zone to a radiation exit surface of the semiconductor chip. In this example, the optical properties of the rear side of the semiconductor chip are essentially determined by the further highly reflective Bragg mirror, and only slightly or not at all by the optically active layer, which is applied to the rear side of the Bragg mirror.

An optoelectronic component having a semiconductor chip as described above is particularly suitable to be used together with a conversion element. The semiconductor chip preferably emits blue light. Particularly preferably, the conversion element surrounds the semiconductor chip. For example, the semiconductor chip is embedded in the conversion element. The optoelectronic component is, for example, a light-emitting diode.

The conversion element is adapted to convert radiation of the first wavelength range into radiation of another wavelength range. For example, the conversion element may convert radiation of the first wavelength range at least partially into radiation of a second wavelength range and/or a third wavelength range. For example, the conversion element converts blue radiation of the semiconductor chip partially into green and/or yellow and/or red radiation. In this way, an optoelectronic component may be produced, which emits mixed-colored radiation from converted blue radiation and green and/or yellow and/or red radiation. The color locus of the mixed-colored light is particularly preferably located in the white region of the CIE standard chromaticity diagram.

The optically active layer is in particular preferably formed, to transmit unconverted radiation of the first wavelength range and reflect converted radiation of the at least one other wavelength range. In this way, efficiency of the optoelectronic component may be advantageously increased.

The conversion element is formed, for example, from a resin into which fluorescent particles are introduced. The resin may be, for example, an epoxide or a silicone or a mixture of these materials. The resin is preferably transparent for electromagnetic radiation and in particular for visible light. The fluorescent particles impart the wavelength-converting properties to the conversion element.

For the fluorescent particles, for example, one of the following materials is suitable: garnets doped with rare earths, alkaline earth sulphides doped with rare earths, thiogallates doped with rare earths, aluminates doped with rare earths and silicates doped with rare earths, orthosilicates doped with rare earths, chlorosilicates doped with rare earths, alkaline earth silicon nitrides doped with rare earths, oxynitrides doped with rare earths, aluminum oxynitride doped with rare earths, silicon nitrides doped with rare earths, sialons doped with rare earths.

In a method of coating a radiation-emitting semiconductor chip with an optically active layer, first a plurality of semiconductor chips are provided on a film. In this case, the semiconductor chips are applied to the film with their radiation exit surfaces, while a rear main surface of the semiconductor chips, which lie opposite to the radiation exit surfaces, points away from the film. In other words, the radiation exit surfaces adjoin the film, while the rear main surfaces of the semiconductor chips opposite to the radiation exit surface are freely accessible. The semiconductor chips are furthermore preferably arranged remote on the film so that regions between the side surfaces of two directly adjacent semiconductor chips are freely accessible.

Finally, an optically active layer is deposited on the semiconductor chips arranged on a film in such a way. Particularly preferably, the optically active layer is deposited at room temperature. For example, the optically active layer is deposited by vapor deposition at room temperature.

Features and examples described herein only in connection with the semiconductor chip may likewise be formed in the method and vice versa.

Further advantages and developments emerge from the examples described below in conjunction with the figures.

Identical, similar or identically acting elements are provided with the same reference numerals in the figures. The figures and the size ratios of the elements illustrated in the figures relative to one another are not to be regarded as being to scale. Rather, individual elements, in particular layer thicknesses, may be illustrated on an exaggeratedly large scale for greater ease of depiction and/or better comprehension.

The semiconductor chip 1 according to the example of FIG. 1 has a substrate 2 on which a semiconductor layer sequence 3 is grown epitaxially. The epitaxial semiconductor layer sequence 3 comprises an active zone 4 in which electromagnetic radiation is generated. The epitaxial semiconductor layer sequence 3 is based on a nitride compound semiconductor. Electromagnetic radiation of a first wavelength range from the blue spectral range is generated in the active zone 4, in other words, blue light is generated. The blue light is emitted by a radiation exit surface 5 of the semiconductor chip 1 that lies opposite to a rear main surface 6 of the substrate 2. Furthermore, it is also possible that green light is generated in the active zone.

Furthermore, the semiconductor chip 1 according to the example of FIG. 1 comprises a current spreading layer 7 formed, for example, from a transparent conductive oxide or has a transparent conductive oxide. For example, the current spreading layer 7 is formed from ITO. An electrical contact 8 for electrical contacting is arranged on the current spreading layer 7.

The substrate 2 is formed from sapphire and transparent to the blue light, which is generated in the active zone 4. For this reason, the semiconductor chip 1 also emits blue light from side surfaces 9 of the substrate 2.

A highly reflective Bragg mirror 10 formed to reflect the blue radiation of the active zone 4 and deflect the blue radiation to the radiation exit surface is arranged on the rear main surface 6 of the substrate 2.

Furthermore, the semiconductor chip 1 according to the example of FIG. 1 comprises an optically active layer 11, which in this case, is likewise formed as a Bragg mirror. In this case, the optically active layer 11 completely covers the rear main surface of the semiconductor chip 1 and side surfaces 9 of the substrate 2. The optically active layer 11 formed as a Bragg mirror is formed to transmit blue light from the active zone 4 and increase the coupling out of the side surfaces 9 of the substrate 2 in this way.

The semiconductor chip 1 according to the example of FIG. 2 also has an optically active layer 11 designed as a Bragg mirror such as the semiconductor chip 1 according to the example of FIG. 1. However, in this example, in contrast to the Bragg mirror according to FIG. 1, the Bragg mirror has not only the property to transmit blue radiation from the active zone 4 and increase the coupling out of the side surfaces 9 of the substrate 2, but has also the additional property of reflecting green, yellow and red light. The Bragg mirror particularly preferably also filters out a portion of the blue radiation of the first wavelength range so that only a very narrow band is transmitted at blue wavelengths. In combination with a conversion element 12, a white LED may thus be produced, which color locus may be set particularly precisely. The Bragg mirror according to FIG. 2 may be formed, for example, from a layer sequence having alternating individual layers made of silicon dioxide and titanium oxide.

In contrast to the semiconductor chip 1 according to the example of FIG. 2, the semiconductor chip 1 according to the example of FIG. 3 has an absorption layer 13 on the radiation exit surface 5. The absorption layer 13 is provided and formed to absorb radiation of the active zone 4 in a targeted manner and thus adjust the brightness of the semiconductor chip 1 in a targeted manner. The absorption layer 13 is provided at the same time to contact the semiconductor layer sequence 3 and has at least two separate structure elements (not shown). In particular, the absorption layer 13 is composed of two separate bonding pads, each of which connects to at least one current bar. Particularly preferably, the absorption layer 13 is formed from a metal.

Furthermore, in contrast to the semiconductor chip 1 according to the example of FIG. 2, the semiconductor chip 1 according to the example of FIG. 3 has no additional highly reflective Bragg mirror 10 on the rear main surface 6 of the substrate 2. Rather, the optically active layer 11 is applied to the substrate in direct contact. In this example, the optically active layer 11 is a Bragg mirror formed to reflect the radiation of the active zone 4. In this way, the Bragg mirror increases the reflection coefficient on the side surfaces 9 and the rear main surface 6 of the substrate 2 and reduces the transmission coefficient. In this way, the brightness of the semiconductor chip may be set to a predetermined value by selecting the individual layers of the Bragg mirror.

In contrast to the semiconductor chip 1 according to the example of FIG. 3, the semiconductor chip 1 according to the example of FIG. 4 has an optically active layer 11 formed from a single metallic layer. In this case, the metallic layer is formed from titanium or has titanium. The thickness of the metallic layer is approximately 100 nanometers. The titanium layer is suitable in particular for absorbing incident blue, green, yellow and red radiation to a larger extent. Thus, for example, the color locus of an optoelectronic component having a blue-emitting semiconductor chip 1 and a green, yellow and red-converting conversion element 12 may be adjusted in a targeted manner. With the aid of the absorption layer 13 on the radiation exit surface 5 of the semiconductor chip 1, the entire brightness of the component may furthermore be adapted to a predetermined value.

As an alternative to the titanium layer, a gold layer having a layer thickness of approximately 100 nanometers may also be used as the optically active layer 11. Such a gold layer has the property of absorbing the impinging blue radiation of the active zone 4 to a large extent, while green, yellow and red light, which may be generated, for example, by a conversion element 12 surrounding the semiconductor chip 1, is reflected to a large extent.

The semiconductor chip 1 according to the example of FIG. 5 has a layer sequence as an optically active layer 11 consisting of a first metallic layer 14 and a second metallic layer 15. In this case, the first metallic layer 14 is formed, for example, from titanium and provided to absorb electromagnetic radiation of the active layer 4 while the second metallic layer 15 is formed, for example, from gold and serves for protection of the titanium layer 14 from external influences such as, for example, moisture. Alternatively to a gold layer 15 to protect the titanium layer 14, a chromium layer 15 may also be used. A titanium layer as first metallic layer 14 has, for example, a thickness of approximately 100 nanometers, whereas a chromium layer as a further metallic layer 15 has, for example, a thickness of approximately 200 nanometers.

Figure 6:
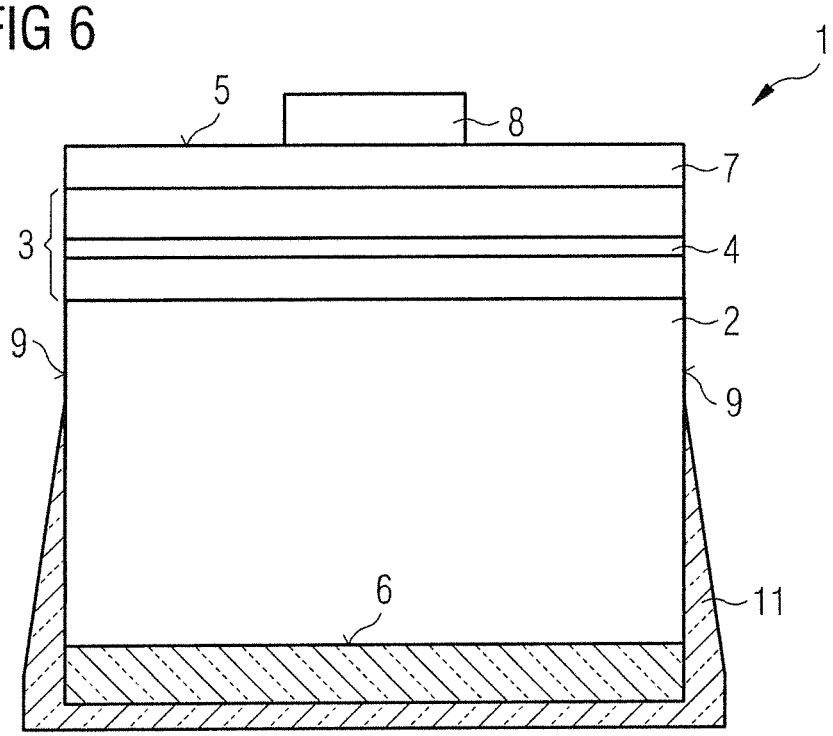

The semiconductor chip 1 according to the example of FIG. 6 has an optically active layer 11 applied over the entire surface of a rear main surface of the semiconductor chip 1 and extends from the rear main surface of the semiconductor chip 1 over the side surfaces 9 of the semiconductor chip 1. In this case, the thickness of the optically active layer 11 decreases continuously from the rear main surface of the semiconductor chip 1 to its radiation exit surface 5. Furthermore, the optically active layer 11 is arranged only in a region of the side surface 9 that adjoins the rear main surface, while a second region of the side surface 9 that adjoins the light exit surface 5, is free of the optically active layer 11.

Figure 7:
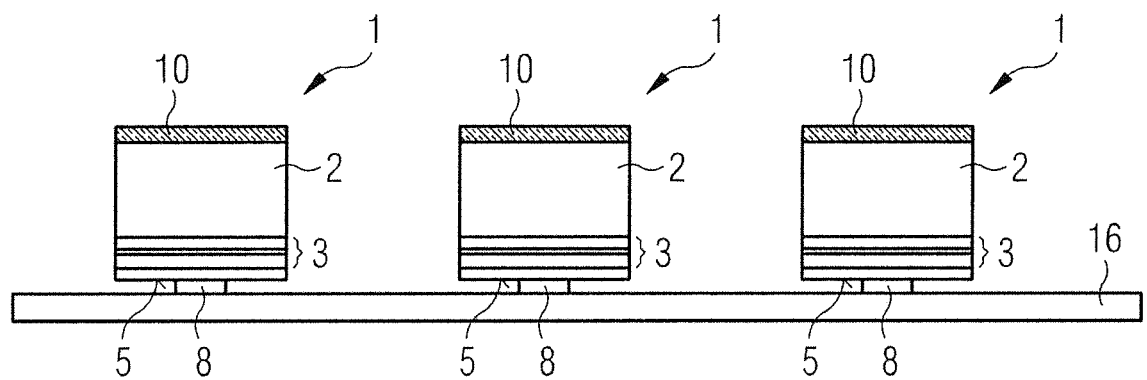
FIGS. 7 to 9 show schematic sectional illustrations of an example of a method of producing a plurality of optoelectronic semiconductor chips.
Figure 8:
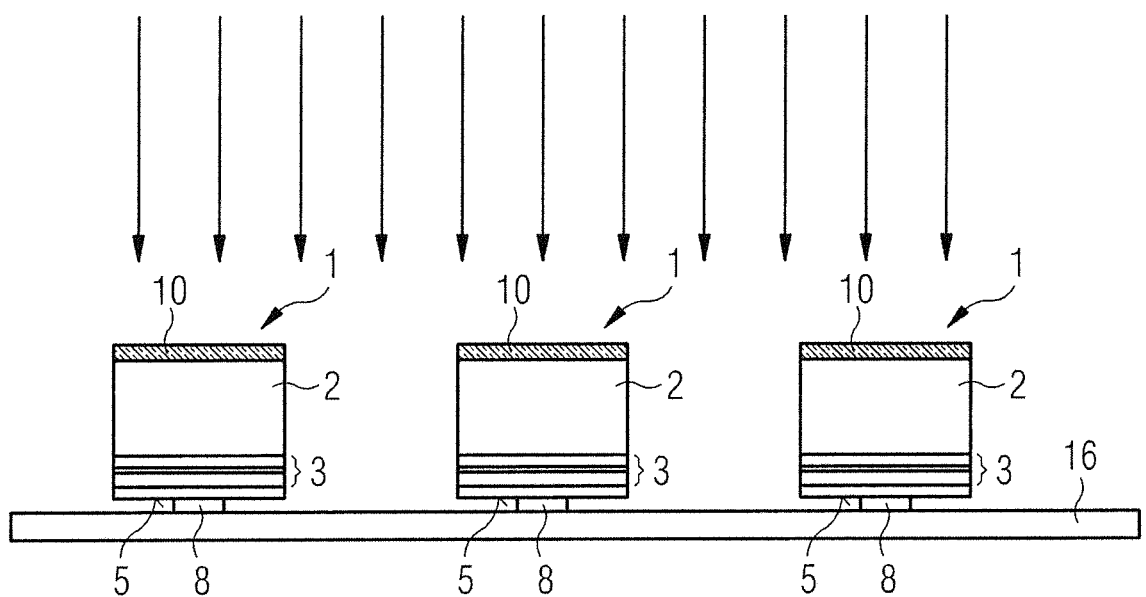
Figure 9:
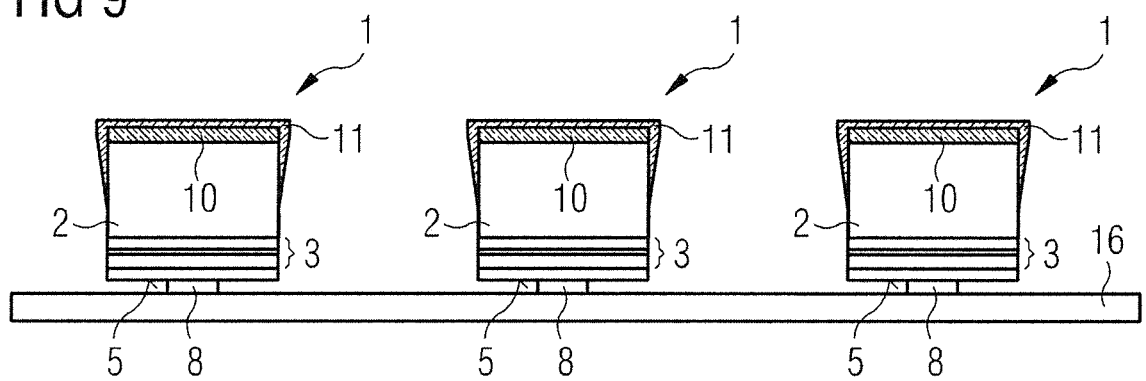

In the method according to the example of FIGS. 7 to 9, first a plurality of semiconductor chips 1 are provided on a film 16. In this case, the semiconductor chips 1 are applied to the film 16 by their radiation exit surfaces 5 so that a rear main surface of the semiconductor chips 1 facing the radiation exit surface 5 is freely accessible. Furthermore, the semiconductor chips 1 are arranged remote from one another so that regions of two directly adjacent semiconductor chips are freely accessible (FIG. 7).

In a next step, which is schematically illustrated in FIG. 8, an optically active layer 11 is applied to the semiconductor chips 1, for example, by evaporation at room temperature.

By the evaporation process, an optically active layer 11 is deposited on the rear main surface of the semiconductor chips 1 and on the side surfaces of the semiconductor chips 1, as previously described, for example, on the basis of the example of FIG. 6 (FIG. 9).

Figure 10:
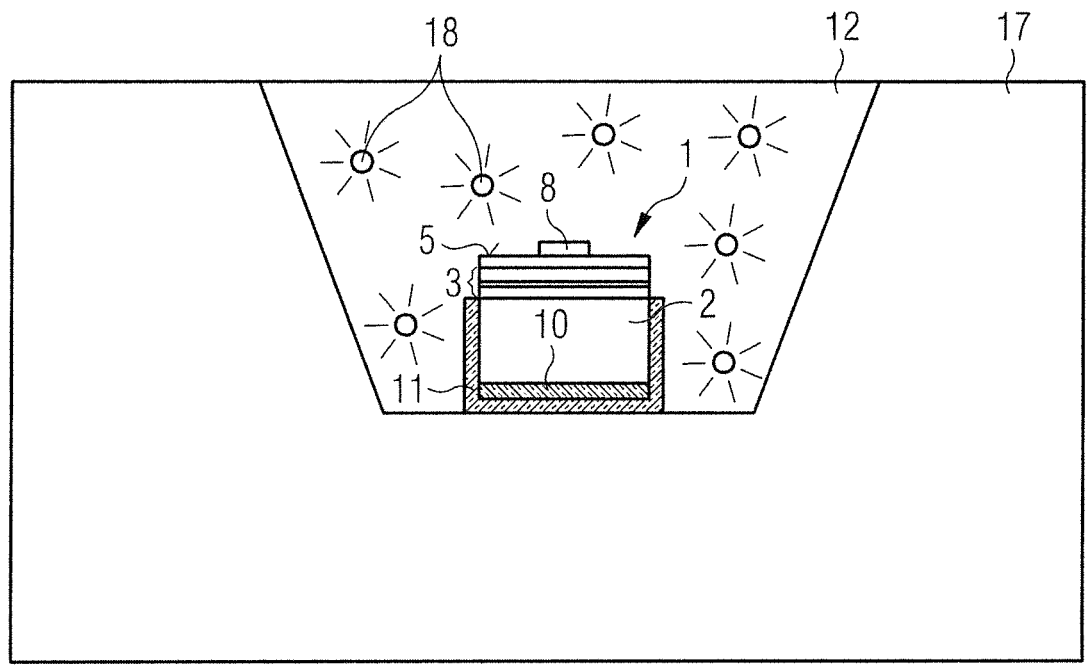
FIG. 10 shows a schematic sectional illustration of an optoelectronic component according to an example.

The optoelectronic component according to the example of FIG. 10 comprises a radiation-emitting semiconductor chip 1, as previously described, for example, with reference to FIG. 2. The semiconductor chip 1 is adhesively bonded into a recess of a component housing 17 filled by a conversion element 12. The conversion element 12 is formed from a resin such as a silicone, into which fluorescent particles 18 are introduced. The fluorescent particles 18 are suitable for partially converting blue radiation of the semiconductor chip 1 into yellow radiation and red radiation so that the optoelectronic component emits mixed-colored radiation from blue, yellow and red radiation. The mixed-colored radiation preferably has a color location in the white region.

The semiconductor chip further comprises an optically active layer 11 applied over the entire surface on the side surfaces and on the rear main surface of the semiconductor chip 1. In this case, the optically active layer 11 is formed from a Bragg mirror that transmits only a portion of the blue radiation of the active zone. Furthermore, the Bragg mirror is formed reflective for converted radiation of the conversion element 12. In this way, the efficiency of the optoelectronic component may be increased and the color locus of the white mixed-colored light may be set.

In this example, the highly reflective Bragg mirror 12 on the rear main surface 6 of the substrate 2 advantageously prevents that electromagnetic radiation of the first wavelength range degrades an adhesive layer (not shown) with which the semiconductor chip 1 is fastened in the recess.

This application claims priority of DE 102015119553.4, the subject matter of which is incorporated by reference.

The description made with reference to the examples does not restrict this disclosure to these examples. Rather, the disclosure encompasses any novel feature and any combination of features, including in particular any combination of features in the claims, even if the feature or combination is not itself explicitly indicated in the claims or examples.

The invention claimed is:

1. A radiation-emitting semiconductor chip comprising:
   a substrate;
   an epitaxial semiconductor layer sequence having an active zone that generates electromagnetic radiation of a first wavelength range, wherein the substrate is transparent to electromagnetic radiation of the active zone; and
   an optically active layer arranged on a side surface of the substrate and on a rear main surface of the semiconductor chip, which lies opposite to a radiation exit surface of the semiconductor chip, wherein the optically active layer is a Bragg mirror that absorbs radiation of the active zone in a targeted manner over the entire first wavelength range.

2. The radiation-emitting semiconductor chip according to claim 1, wherein the optically active layer is applied over the entire surface to rear main surface of the semiconductor chip and is applied over the entire surface to the side surface of the substrate.

3. The radiation-emitting semiconductor chip according to claim 1, wherein a region of the side surface of the substrate adjoining a rear main surface thereof is covered continuously with the optically active layer, while a further region of the side surface of the substrate is free of the optically active layer.

4. The radiation-emitting semiconductor chip according to claim 1, wherein the thickness of the optically active layer on the side surface of the substrate decreases from the rear main surface towards a radiation exit surface.

5. The radiation-emitting semiconductor chip according to claim 1, wherein which the radiation exit surface is provided with an absorption layer that absorbs radiation of the active zone in a targeted manner to adjust the brightness of the semiconductor chip to a desired value.

6. The radiation-emitting semiconductor chip according to claim 1, wherein a highly reflective Bragg mirror that reflects radiation of the active zone is applied on the rear main surface of the substrate.

7. An optoelectronic component comprising a semiconductor chip, said semiconductor chip comprising:
   a substrate;
   an epitaxial semiconductor layer sequence having an active zone that generates electromagnetic radiation of a first wavelength range, wherein the substrate is transparent to electromagnetic radiation of the active zone; and
   an optically active layer arranged on a side surface of the substrate and on a rear main surface of the semiconductor chip, that lies opposite to a radiation exit surface of the semiconductor chip, wherein
   the semiconductor chip is surrounded by a conversion element that converts radiation of the first wavelength range into radiation of at least one other wavelength range, and
   the optically active layer transmits unconverted radiation of the first wavelength range and reflects at least partially converted radiation of the at least one other wavelength range.

8. A radiation-emitting semiconductor chip comprising:
   a substrate;
   an epitaxial semiconductor layer sequence having an active zone that generates electromagnetic radiation of a first wavelength range, wherein the substrate is transparent to electromagnetic radiation of the active zone; and
   an optically active layer arranged on a side surface of the substrate and on a rear main surface of the semiconductor chip, which lies opposite to a radiation exit surface of the semiconductor chip, wherein the optical active layer is a single semiconductor layer that absorbs radiation of the active zone.

* * * * *